United States Patent [19]

Stuebing et al.

[11] Patent Number: 5,097,147

[45] Date of Patent: Mar. 17, 1992

[54] LIMITED AMPLITUDE SIGNAL TRIGGER CIRCUIT

[75] Inventors: Carlton Stuebing, Tigard; Jeffrey O. Bradford, Portland, both of Oreg.

[73] Assignee: Tektronix, Inc., Beaverton, Oreg.

[21] Appl. No.: 649,629

[22] Filed: Feb. 1, 1991

[51] Int. Cl.5 .............................................. H03K 5/00
[52] U.S. Cl. ................................... 307/354; 307/360; 328/146; 328/150
[58] Field of Search .................. 307/350, 354, 360; 328/146, 147, 149, 150; 324/121 R

[56] References Cited

U.S. PATENT DOCUMENTS 4,352,999  10/1982  Galpin ................................. 307/354
4,524,291   6/1985  Lehning .............................. 307/354

Primary Examiner—Robert J. Pascal
Attorney, Agent, or Firm—Peter J. Meza

[57] ABSTRACT

A trigger circuit (20, 50, 80, 90, 100) suitable for triggering an oscilloscope on the occurrence of a limited amplitude input signal includes a first comparator (38) for comparing an input signal to a first, low threshold voltage and for generating a first logic signal, and a second comparator (40) for comparing the input signal to a second, high threshold voltage and for generating a second logic signal. The first and second logic signals are combined in a flip-flop circuit (25) to provided an output logic signal such that the output signal changes logic state subsequent to the input signal crossing and recrossing the first, low threshold voltage without crossing the second, high threshold voltage.

17 Claims, 9 Drawing Sheets

DELAY STAGE

LIMITED AMPLITUDE SIGNAL TRIGGER CIRCUIT

BACKGROUND OF THE INVENTION

This invention relates to electronic triggering circuits, and more particularly to triggering circuits responsive to the occurrence of a limited amplitude input signal, sometimes referred to as a "runt". A typical example of a limited amplitude signal is a pulse that switches from a valid logic state to an invalid logic state, and then switches back to the original valid logic state.

Trigger circuits are well known in the art for starting the sweep of an oscilloscope trace across a display device such as a cathode ray tube ("CRT") at the same trigger point on a repetitive signal. Typically, prior art trigger circuits include slope and level controls. The slope control determines whether the trigger point is found on the rising or the falling edge of the repetitive signal. The level control is a single voltage threshold level that determines where on that edge the trigger point occurs.

A block diagram of a typical oscilloscope 10 is shown in FIG. 1. An input signal is received at input terminal 12 and amplified by a preamplifier 14. The output of the preamplifier 14 is further amplified by vertical amplifier 16 to control the amplitude of the trace of the input signal on CRT 18. The output of the preamplifier 14 is also coupled to the input 22 of trigger circuit 20. The output 24 of trigger circuit provides a trigger pulse to activate timebase circuit 26. Timebase circuit 26 is typically a ramp signal for real-time analog oscilloscopes, and a clocked memory for digital storage oscilloscopes. The output of the timebase circuit 26 is amplified by horizontal amplifier 28 and controls the rate at which the trace of the input signal is swept across CRT 18.

Single threshold trigger circuits are not well suited to detecting limited amplitude signals. Digital signals, for example, have a lower threshold and an upper threshold that define valid logic low and high states, as well as an invalid or forbidden zone. A single threshold cannot completely define a digital signal, and therefore cannot provide the basis for a trigger circuit capable of triggering on the occurrence of a limited amplitude signal that switches from a valid logic state to an invalid logic state and back to the original valid logic state.

A trigger circuit having two voltage thresholds or level controls is shown in U.S. Pat. No. 4,823,076 to Haines et al. FIG. 4 of Haines et al shows a decoder 815 that provides signals VH, VT, and VL that are each components of an input digital signal indicating when the input signal is in the logic high, transition (invalid or forbidden), and logic low zones. These signals, in addition with considerable additional hardware and software, provide a trigger circuit that is capable of triggering on any pattern of logic high, low, or invalid states in an input signal.

What is desired is a hardware trigger circuit having a relatively low parts count that is capable of triggering on the occurrence of a limited amplitude input signal.

SUMMARY OF THE INVENTION

It is an object of the invention to provide a triggering circuit having two thresholds or level controls that is capable of triggering on limited amplitude signals.

A second object of the invention is to provide a triggering circuit that can be used in combination with other trigger circuits to provide multiple trigger pulses.

A third object of the invention is to provide an output indication either on the first occurrence of a limited amplitude signal, or on each occurrence of the limited amplitude signal.

A fourth object of the invention is to provide a trigger circuit capable of triggering on singlepolarity or dual-polarity limited amplitude signals.

To achieve these objects, a trigger circuit suitable for triggering an oscilloscope on the occurrence of a limited amplitude input signal includes a first comparator for comparing an input signal to a first, low threshold voltage and for generating a first logic signal, and a second comparator for comparing the input signal to a second, high threshold voltage and for generating a second logic signal. The first and second logic signals are combined in a flip-flop logic circuit to provide an output logic signal such that the output signal changes logic state subsequent to the input signal crossing and recrossing the first, low threshold voltage without crossing the second, high threshold voltage.

The foregoing and other objects, features, and advantages of the present invention are apparent from the following detail description of the invention that proceeds with reference to the accompanying drawing figures.

BRIEF DESCRIPTION OF THE DRAWING FIGURES

DETAILED DESCRIPTION OF THE INVENTION

Figure 1:
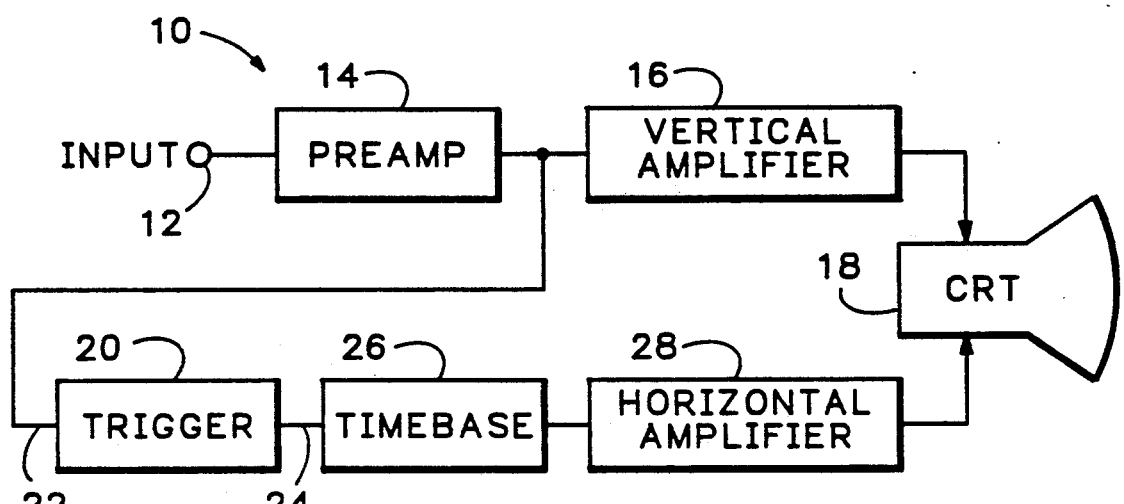
FIG. 1 is a block diagram of a prior art oscilloscope.
Figure 2:
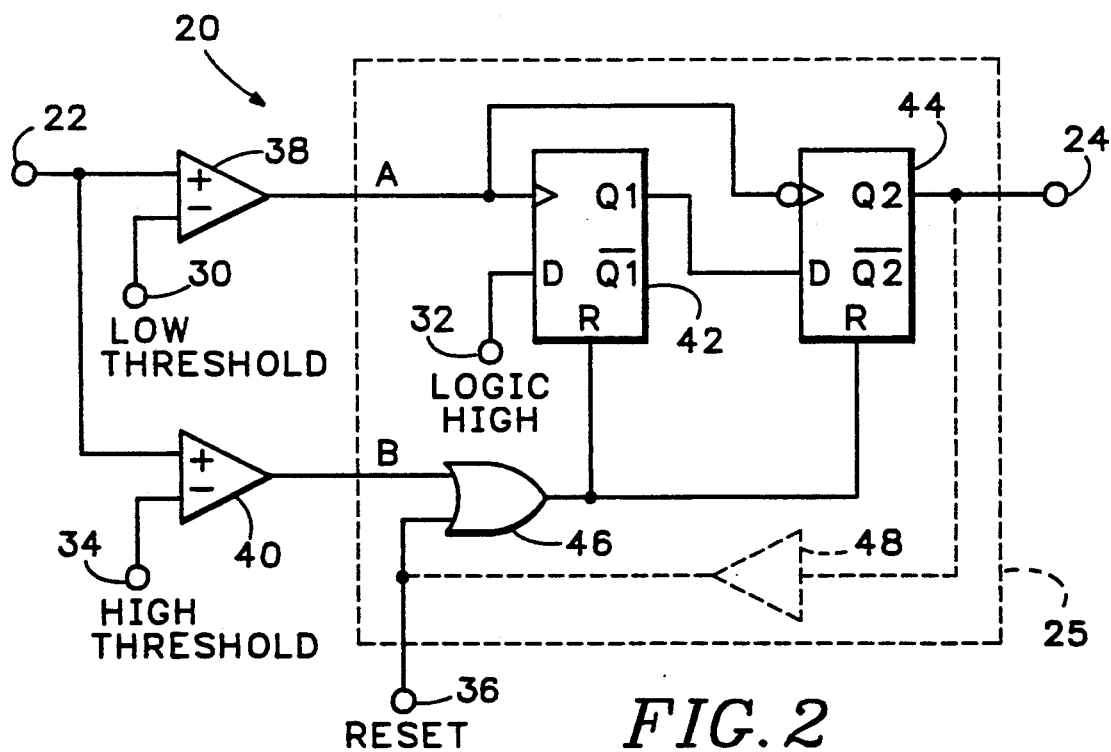
FIG. 2 is a schematic diagram of a single-polarity embodiment of the trigger circuit of the present invention.

A trigger circuit 20 suitable for triggering an oscilloscope on the occurrence of a single-polarity limited amplitude input signal is shown in FIG. 2. An input terminal 22 receives an input signal. The input signal can be either an analog or digital signal. An output terminal 24 provides an output signal that changes logic states upon the occurrence of the limited amplitude input signal. The relevant characteristic of the limited amplitude input signal is that the signal crosses a low threshold or high threshold into the region between the two thresholds, and subsequently recrosses the original threshold. Two such limited amplitude pulses are best seen in the input waveform designated V(22) in FIG. 3.

The two limited amplitude pulses are bounded by two full amplitude pulses.

The trigger circuit 20 includes a first comparator 38 and a second comparator 40. Each comparator has a positive input that is coupled to the input terminal 22. The negative input of the first comparator 38 is coupled to a low threshold voltage source 30. If desired, the low threshold voltage can be set to the most positive valid logic low level for a specific logic swing. The negative input of the second comparator 40 is coupled to a high threshold voltage source 34. If desired, the high threshold voltage can be set to the most negative valid logic high level for a specific logic swing. Thus, the first comparator 38 generates a first logic signal designated "A" that changes logic states when the input signal crosses the low threshold voltage. Similarly, the second comparator generates a second logic signal designated "B" that changes logic states when the input signal crosses the high threshold voltage. Waveforms of logic signals A and B are shown in the timing diagram of FIG. 3, wherein the two logic signals respond to the input signal waveform designated V(22).

Referring again to the trigger circuit 20 of FIG. 2, the first and second logic signals A and B are combined in a flip-flop circuit 25 including first and second D-type flip-flops 42 and 44 to provide an output logic signal at the output terminal 24. The output logic signal changes logic state subsequent to the input signal crossing and recrossing the first threshold voltage without crossing the second threshold voltage, as is further explained below. A first D-type flip-flop 42 has a clock input for receiving the first logic signal, a D input 32 coupled to a logic high voltage, a reset input for receiving the second logic signal, and an output. A second D-type flip-flop 44 has an inverted clock input for receiving the first logic signal, a D input coupled to the output of the first D-type flip-flop 42, a reset input for receiving the second logic signal, and an output coupled to the output terminal 24.

In operation, the trigger circuit 20 is initialized by a positive-going reset signal on terminal 36. The reset signal going false (low) determines the time at which the trigger circuit 20 begins to look for an occurrence of the limited amplitude input signal. The first flip-flop 42 clocks on the positive edge of the first logic signal as the input signal crosses the lower threshold voltage. If the input signal subsequently crosses the upper threshold voltage, flip-flop 42 is reset by the positive edge of the second logic signal. When the input signal again crosses below the lower threshold voltage, flip-flop 44 is clocked by the negative edge of the first logic signal. (Note that flip-flop 44 has an inverted clock input.) Thus, if the input signal previously crossed the upper threshold voltage, flip-flop 44 clocks a logic low and trigger circuit 20 provides no indication of a limited amplitude input signal. If the input signal did not cross the upper threshold voltage, flip-flop 42 is not reset, the output is at a logic high, and therefore flip-flop 44 clocks a logic high. Thus, trigger circuit 20 provides an indication of a limited amplitude input signal at the output 24.

Figure 3:
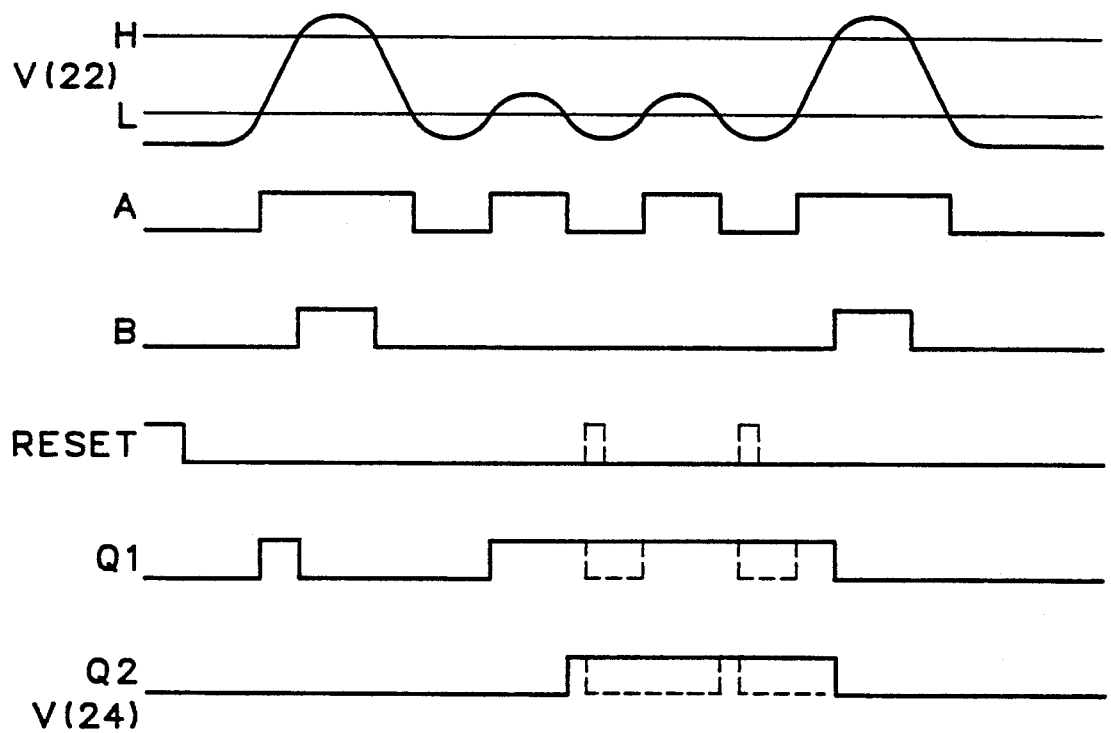
FIG. 3 is a timing diagram for the circuit of FIG. 2.

The timing diagram of FIG. 3 corresponds to the operation of trigger circuit 20 of FIG. 2. The input signal V(22) is a waveform with a full amplitude pulse followed by two limited amplitude pulses and another full amplitude pulse. Corresponding first and second logic signals are shown as waveforms A and B. The output of flip-flop 42 is shown as waveform Q1. Note that waveform Q1 switches to a logic high on the positive edge of the first logic signal A, but switches to a logic low on the positive edge of the second logic signal, B. The output of flip-flop 44, also the output terminal 24, is shown as waveform Q2 or V(24). Note that waveform Q2 switches to a logic high subsequent to the input signal crossing and recrossing the first threshold voltage without crossing the second threshold voltage. Note also that waveform Q2 stays high on subsequent occurrences of limited amplitude pulses.

Referring again to FIG. 2, a reset input 36 is provided for resetting the output logic signal at any time without respect to the amplitude or state of the input signal. Thus, OR gate 46 is provided having a first input coupled to the output comparator 42 to receive the second logic signal, B, and a second input 36 for receiving the reset signal. Switching a logic high on the reset input resets the outputs of flip-flops 42 and 44 to a logic low, forcing a logic low at the output terminal 24. The reset signal is designated RESET in the timing diagram of FIG. 3.

Trigger circuit 20 provides a single indication of a limited amplitude input signal (until the next occurrence of a full amplitude signal). However, trigger circuit 20 can be modified with a single buffer stage 48 to provide a pulse for each occurrence of a limited amplitude signal. Each pulse can be counted to create a record of the total number of limited amplitude signals. Buffer stage 48 has an input coupled to the output terminal 24 of the trigger circuit 20, an output coupled to the reset input 36, and a predetermined delay from the input to the output. In operation, buffer stage 48 propagates the edge of the output signal to the reset input 36. While the output signal is propagating though buffer stage 48, the output signal at output terminal 24 remains high. Once the output signal propagates to the reset input 36, flip-flops 42 and 44 are reset and the output signal switches to a logic low. Thus, a narrow "sliver pulse" having a duration equal to the total delay through buffer stage 48, OR gate 46, and the reset-to-output path of flip-flop 44 is generated for each occurrence of the limited amplitude input signal. The duration of the sliver pulse can be adjusted by adjusting the delay of any of these circuit elements or by adding an additional delay element.

The optional countable output feature of trigger circuit 20 is shown in dashed lines in the timing diagram of FIG. 3. Output waveform Q2 switches to a logic high upon the first occurrence of the limited amplitude input signal. Shortly thereafter the reset input, designated RESET, switches high, forcing waveforms Q1 and Q2 low. The reset input remains high for a short time. Subsequently, the next crossing of the low threshold clocks flip-flop 42, switching waveform Q1 to a logic high. The next recrossing of the low threshold without crossing the high threshold clocks flip-flop 44, switching waveform Q2 to a logic high. Therefore each occurrence of a limited amplitude pulse is indicated by a sliver pulse at the output terminal 24.

Figure 4:
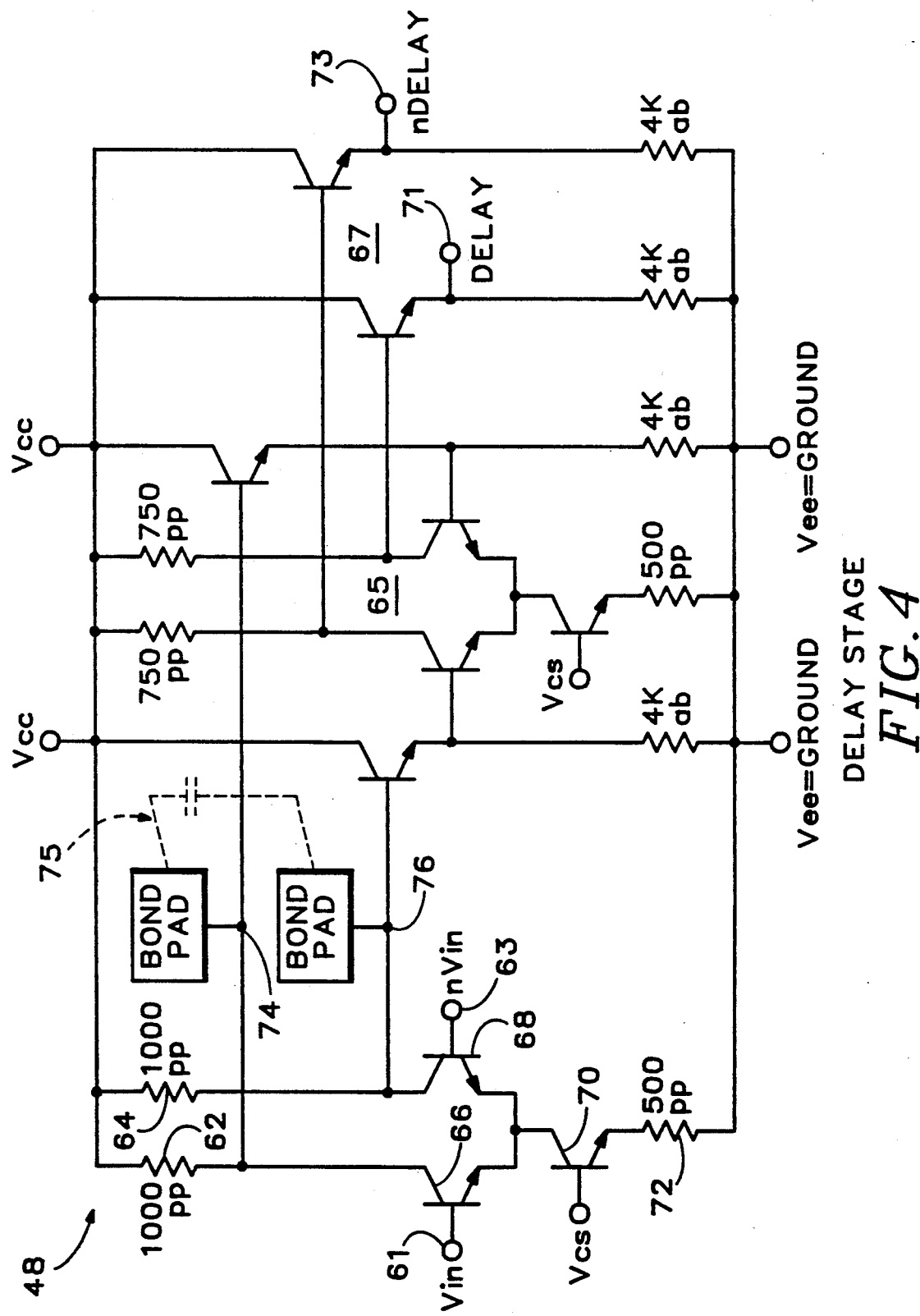
FIG. 4 is a schematic diagram of a buffer stage having a predetermined delay from the input to the output.

A buffer stage 48 having a adjustable delay from input to output is shown in greater detail in FIG. 4. The buffer stage 48 is compatible with emitter-coupled logic ("ECL") levels and has a delay time that is set by an external capacitor 75. The ECL buffer stage 48 has first and second switching transistors 66 and 68, a bias transistor 70 and resistor 72, and load resistors 62 and 64. The base of bias transistor 70 is biased by an appropriate bias voltage, Vcs. A differential ECL level input voltage, (Vin, nVin), is supplied to the bases of transistors 66 and 68 at terminals 61 and 63.

Buffer stage 48 further includes a gain stage 65 coupled to the collectors of transistors 66 and 68. Gain stage 65 drives an output buffer stage 67. A differential output voltage, (Vout, nVout) is provided at terminals 71 and 73. The total delay is determined largely by the capacitance of external capacitor 75 and the collectors of transistors 66 and 68, the value of load resistors 62 and 64, and the value of the bias current provided by transistor 70. To a first order approximation, the delay of ECL buffer stage 48 is provided by the value of resistors 62 and 64 multiplied by the value of the capacitance of the external capacitor 75 and the collectors of transistors 66 and 68. Once a value for resistors 62 and 64 is chosen to determine the amount of delay desired, the current in transistor 70 is set to provide an appropriate voltage drop across resistors 62 and 64. The voltage drop is set to about 0.8 volts for an ECL voltage swing.

Figure 5:
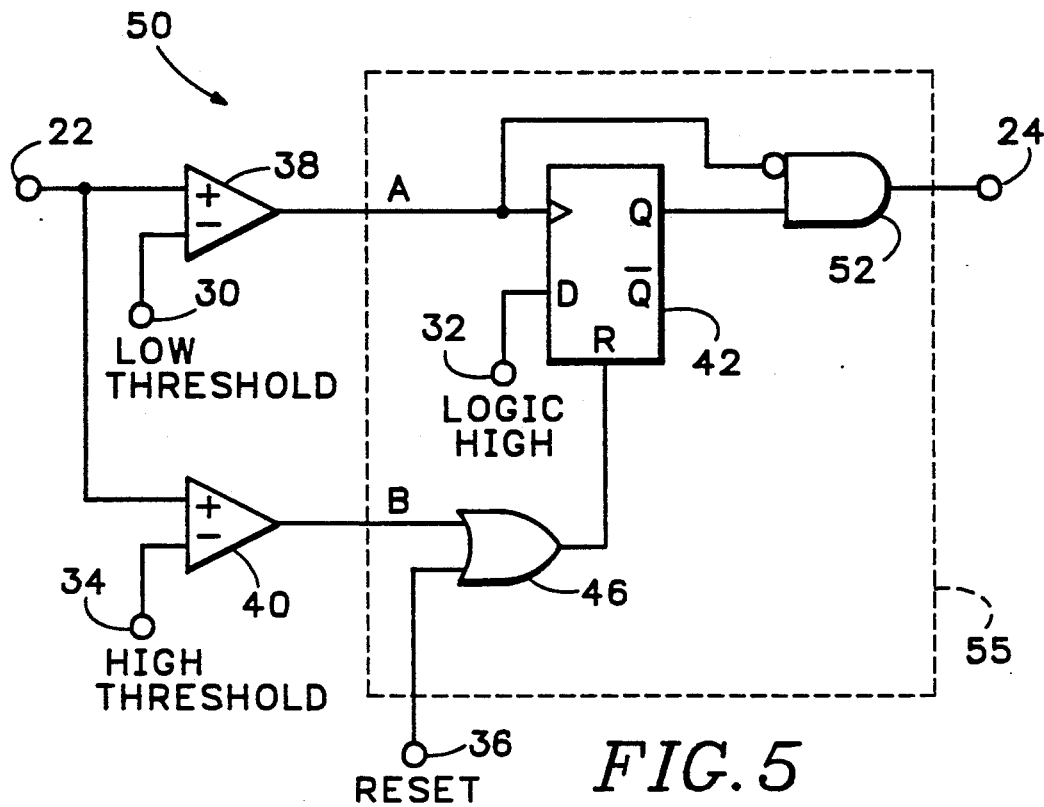
FIG. 5 is a schematic diagram of an alternative single-polarity embodiment of the trigger circuit of the present invention.

An alternative embodiment for trigger circuit 20 is shown in FIG. 5. Trigger circuit 50 includes an alternative flip-flop circuit 55 for combining first and second logic signals A and B. A D-type flip-flop 42 has a clock input for receiving the first logic signal, a D input 32 coupled to a logic high voltage, a reset input for receiving the second logic signal, and an output. An AND gate 52 has a first input coupled to the output of the D-type flip-flop 42, a second inverted input for receiving the first logic signal, and an output coupled to the output terminal 24.

In operation, trigger circuit 50 generates a pulse at the output terminal 24 for each occurrence of the limited amplitude input signal, which may be counted to provide a record of the total number of such occurrences. The pulse, however, is not a sliver pulse as in trigger circuit 20. The pulse remains high until reset by a subsequent crossing of the low threshold voltage. Flip-flop 42 clocks a logic high to the Q output on the positive edge of the first logic signal, designated A. If the input signal crosses the upper threshold voltage, flip-flop 42 is reset and the output signal at output terminal 24 remains low. However, if the input signal recrosses the lower threshold voltage without crossing the upper threshold voltage, flip-flop 42 retains the clocked logic high at the Q output. Since the inverted input of AND gate 52 is low and the non-inverted input is high, a logic high appears at the output of AND gate 52, indicating the occurrence of a limited amplitude input signal.

Figure 6:
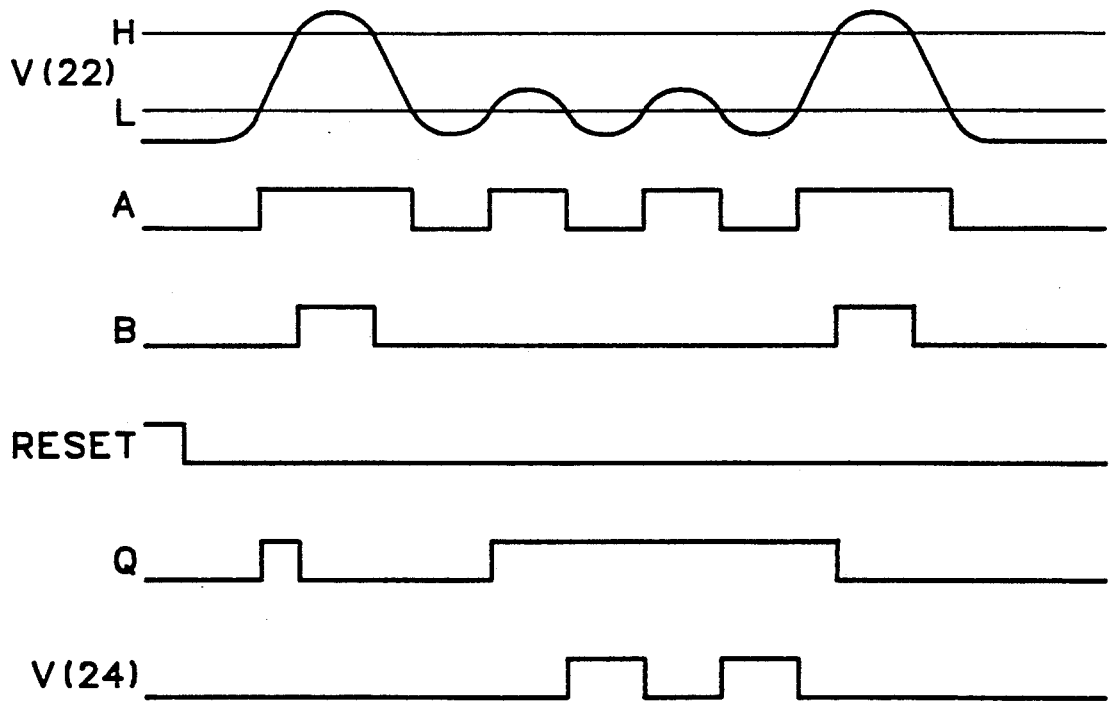
FIG. 6 is a timing diagram for the circuit of FIG. 5.

Corresponding waveforms illustrating the operation of trigger circuit 50 are shown in the timing diagram of FIG. 6. The input signal V(22), and the first and second logic signals, A and B, are the same as those in the timing diagram of FIG. 3. The Q waveform, representing the output of flip-flop 42 is the same as waveform Q1 in FIG. 3. The output waveform, V(24) is different in that two pulses indicate the presence of the two limited amplitude input pulses. Each output pulse returns to a logic low upon the subsequent crossing of the low threshold voltage by the next input signal pulse.

As in previous trigger circuit 20, trigger circuit 50 has a reset input 36. Referring again to FIG. 5, the reset input 36 is provided for resetting the output logic signal at any time without respect to the amplitude or state of the input signal. The reset input 36 comprises an additional input to OR gate 46. Thus, if the reset input 36 is asserted, flip-flop 42 is reset, and therefore the output signal at output terminal 24 is forced low.

Figure 7:
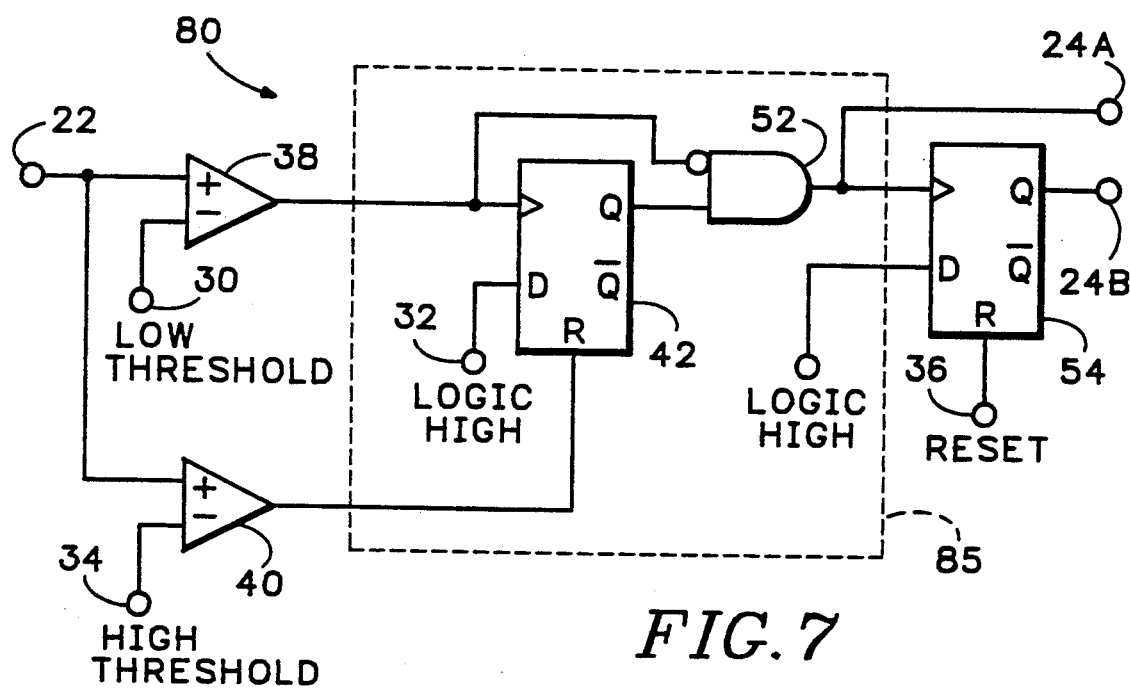
FIG. 7 is a schematic diagram of the trigger circuit of FIG. 5 altered to include a latched output signal.

In FIG. 2, buffer stage 48 transformed the single occurrence "latched" output of trigger circuit 20 into a pulsed, countable output. Contrariwise, in FIG. 7 trigger circuit 80 further includes an output flip-flop 54 for transforming the countable output 24A to a single occurrence latched output 24B. Flip-flop circuit 85 is modified to remove the OR gate 46 seen in flip-flop circuit 25 of FIG. 2. Note also that the output of comparator 40 is now directly coupled to the reset input of flip-flop 42. The output flip-flop 54 has a clock input coupled to the output terminal 24A a logic high coupled to the D-input, and an output for providing a latched output logic signal at terminal 24B. The trigger circuit reset is provided by coupling the reset input of flip-flop 54 directly to the reset input 36.

Trigger circuits 20, 50, and 80 are suitable for detecting the occurrence of a single-polarity limited amplitude input signal. Positive-going limited amplitude signals are detected (crossing and recrossing the low threshold voltage) by trigger circuits 20, 50, and 80 as shown and described above. However, in some applications it may be desirable to detect occurrences of both positive-going and negative-going (crossing and recrossing the high threshold voltage) limited amplitude pulses.

Figure 8:
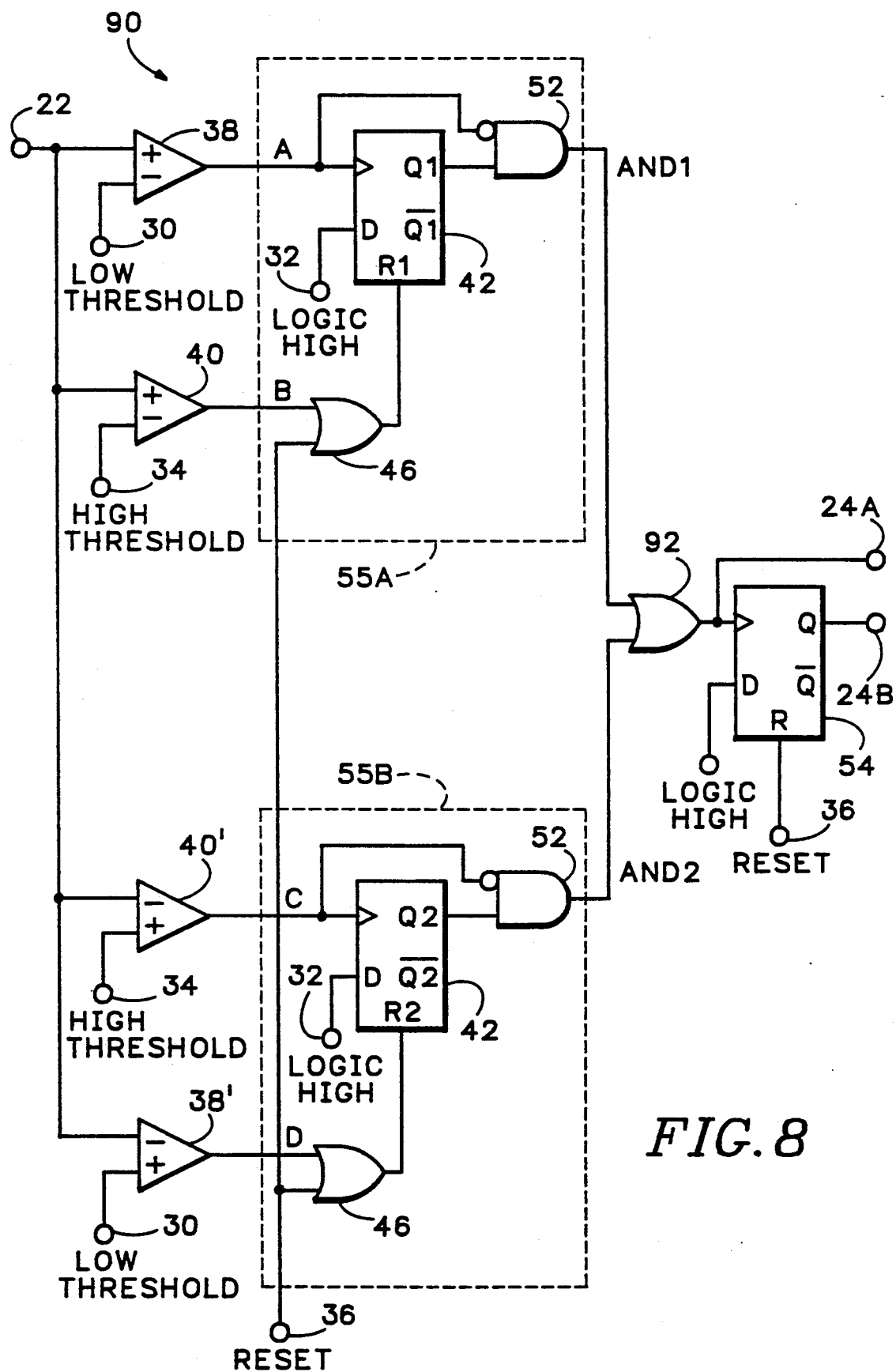
FIG. 8 is a schematic diagram of a dual-polarity embodiment of the trigger circuit of the present invention.

A trigger circuit 90 suitable for triggering an oscilloscope on the occurrence of a dual-polarity limited amplitude is shown in FIG. 8. Trigger circuit 90 includes comparators 38, 40, 40', and 38' coupled to the input terminal 22 for generating logic signals A, B, C, and D. Noting that the polarities of the inputs of comparators 38' and 40' are reversed from comparators 38 and 40, logic signal C is inverted from logic signal B, and logic signal D is inverted from logic signal A. Trigger circuit 90 further includes single-polarity flip-flop circuits 55A and 55B, and an OR gate 92. Flip-flop circuits 55A and 55B are identical to flip-flop circuit 55 shown in FIG. 5. However, due to the polarity of the input logic signals, flip-flop circuit 55A is responsive to a positive-going limited amplitude signal and flip-flop circuit 55B is responsive to a negative-going limited amplitude signal.

Flip-flop circuit 55A combines the first and second logic signals A and B to provide a first output logic signal indicative of a positive-going limited amplitude input signal. The first output logic signal is designated AND1 in FIG. 8. Flip-flop circuit 55B combines the third and fourth logic signals C and D to provide a second output logic signal indicative of a negative-going limited amplitude input signal. The second output logic signal is designated AND2. The first and second output logic signals AND1 and AND2 have the same polarity. A logic high is used to designate the occurrence of a limited amplitude input signal. An OR gate 92 has an input coupled to the output of flip-flop circuit 55A and an input coupled to the output of flip-flop circuit 55B. The output of OR gate 92 is coupled to the output terminal 24A for generating the logical OR combination of the first and second output logic signals. Thus, an indication of both positive-going and negative-going limited amplitude input signals is provided.

Trigger circuit 90 includes a reset input 36 for resetting each of the first and second output logic signals. The reset circuitry is identical to that described for trigger circuit 50 of FIG. 5. However, the reset inputs of flip-flop circuits 55A and 55B are coupled together to form a single reset input 36. As configured in FIG. 8, trigger circuit 90 provides an output pulse for each occurrence of a positive-going or negative-going limited amplitude input signal. If desired, an output flip-flop 54 may be coupled to output terminal 24A to provide an latched output 24B to indicate a single occurrence of a positive-going or negative-going limited amplitude input signal. Alternatively, flip-flop circuits 55A and 55B can be replaced by flip-flop circuit 25 of FIG. 2. If this is done, trigger circuit 90 provides a latched output and the additional output flip-flop 54 is not required.

Figure 9:
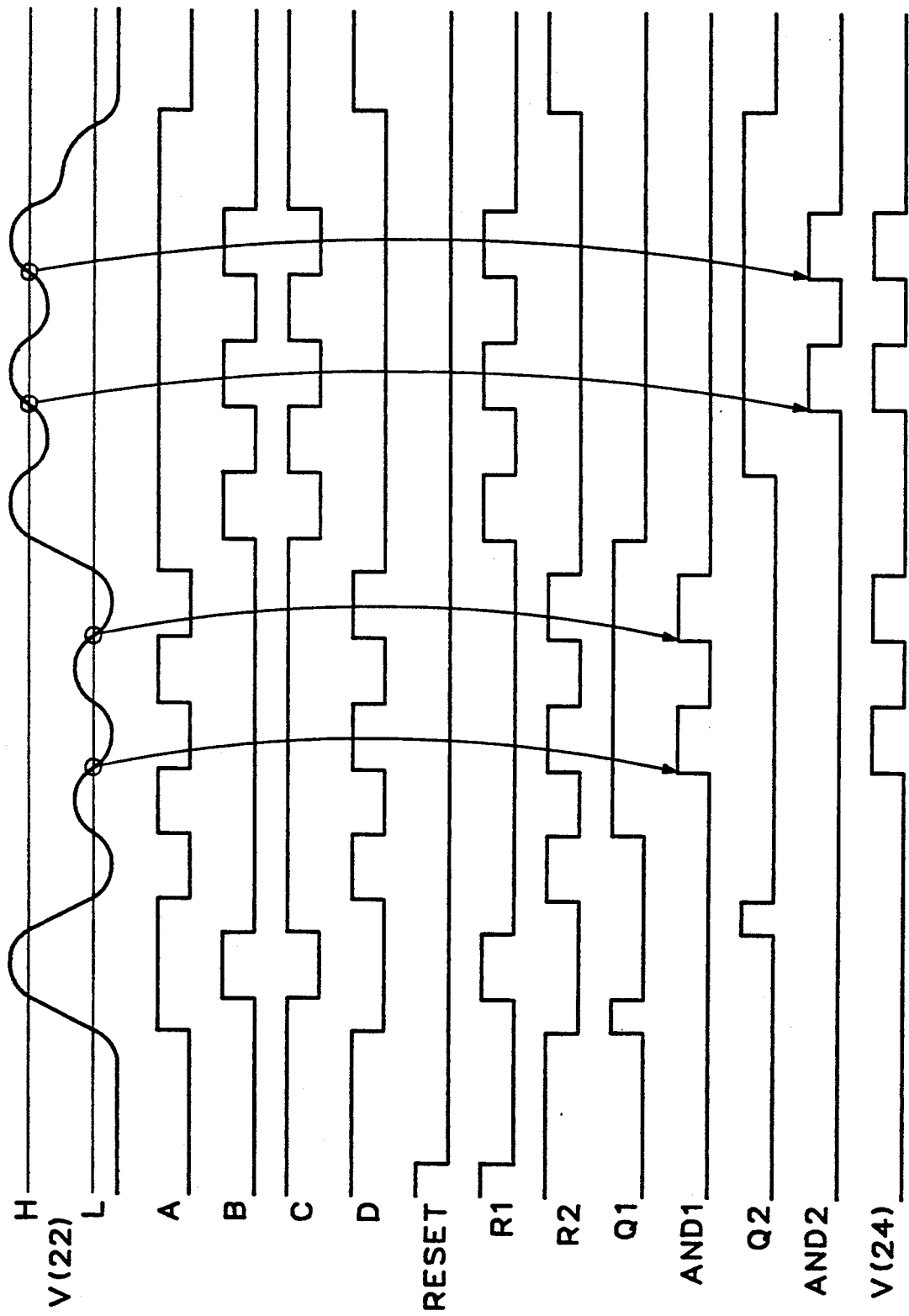
FIG. 9 is a timing diagram for the circuit of FIG. 8.

Corresponding waveforms illustrating the operation of trigger circuit 90 are shown in the timing diagram of FIG. 9. The input signal, V(22) is shown having two positive-going limited amplitude signals and two negative-going limited amplitude signals. Waveforms A, B, C, and D illustrate the logic signals generated in response to the input signal crossing and recrossing the low and high threshold voltages. Waveforms R1 and R2 are the reset inputs to flip-flop 42 in flip-flop circuits 55A and 55B. Waveforms R1 and R2 generally conform to logic signals B and D since the reset input, RESET, is taken low after initializing trigger circuit 90. Waveforms Q1 and Q2 are the outputs of flip-flop 42 of flip-flop circuits 55A and 55B. These waveforms appear at the non-inverting input of the respective AND gate 52 as described above in conjunction with the operation of trigger circuit 50. Waveforms AND1 and AND2 are first and second output logic signals that provide countable indications of positive and negative going limited amplitude input signals. These waveforms are combined with OR gate 92 to generate the output waveform, V(24). Note that output waveform V(24) provides four output pulses corresponding to two occurrences of a positive-going limited amplitude input signal and two occurrences of a negative-going limited amplitude input signal.

Figure 10:
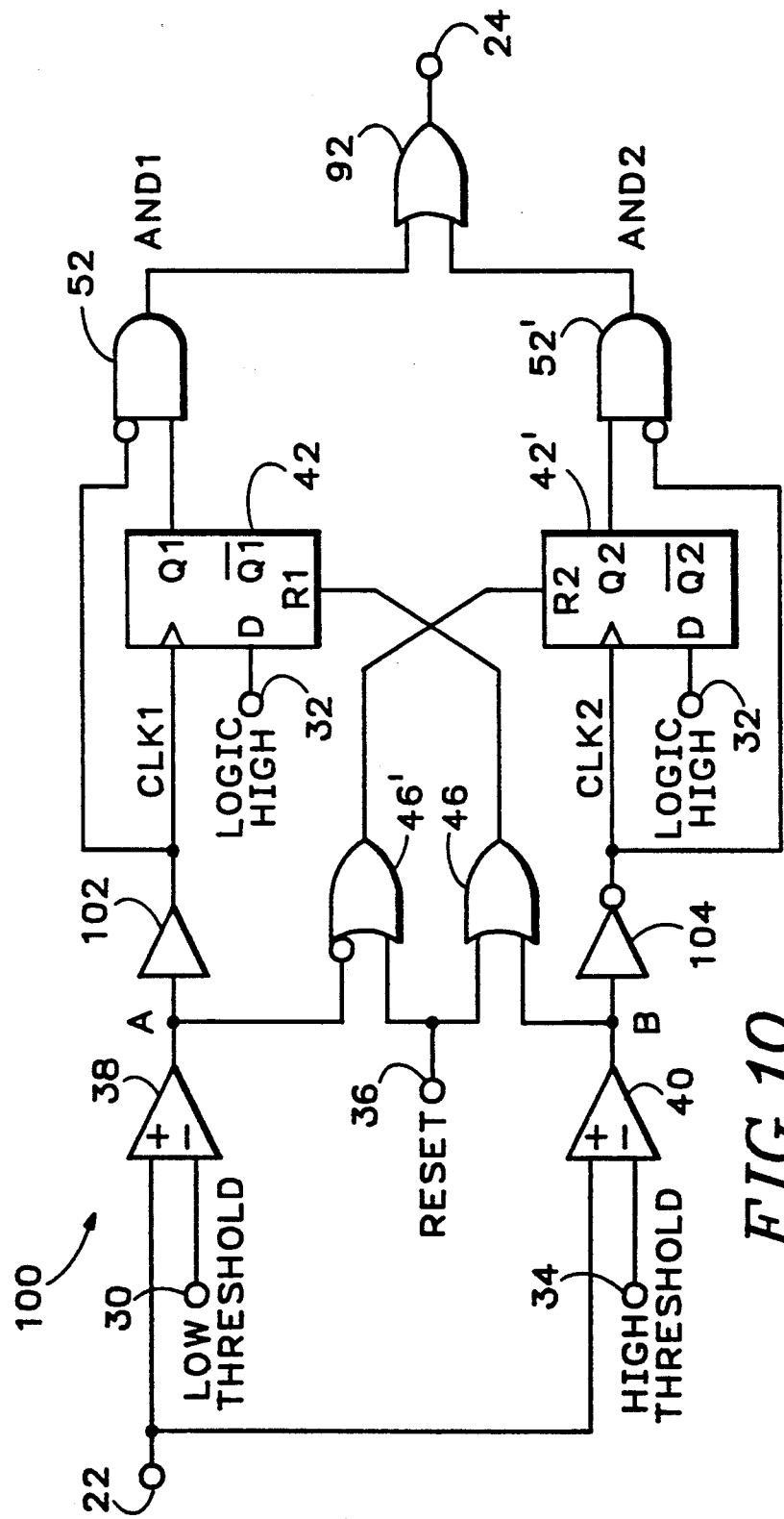
FIG. 10 is a schematic diagram of an alternative dual-polarity embodiment of the trigger circuit of the present invention..

An optimized trigger circuit 100 corresponding to trigger circuit 90 that is also suitable for triggering an oscilloscope on the occurrence of a dual-polarity limited amplitude input signal is shown in FIG. 10. Notable differences include the elimination of comparators 38' and 40' and additional of buffer stage 102 and inverter stage 104. Comparator 38 and comparator 40 are coupled to the input terminal 22 for generating first and second logic signals A and B. Inverted first and second logic signals are generated by OR gate 46' and inverter 104. A first D-type flip-flop 42 has a clock input for receiving the first logic signal, a D input coupled to a logic high voltage, a reset input for receiving the second logic signal, and an output. A first AND gate 52 has a first input coupled to the output of the first D-type flip-flop 42, a second inverted input for receiving the first logic signal, and an output for generating a first output logic signal. A second D-type flip-flop 42' has a clock input for receiving the inverted second logic signal, a D input coupled to a logic high voltage, a reset input for receiving the inverted first logic signal, and an output. A second AND gate 52' has a first input coupled to the output of the second D-type flip-flop 42', a second inverted input for receiving the inverted second logic signal, and an output for generating a second output logic signal. OR gate 92 generates the logical OR combination of the first and second output logic signals to provide the dual-polarity indication at output terminal 24.

Trigger circuit 100 further includes a reset input 36 coupled to OR gates 46 and 46'. When the reset input is asserted, the reset input to flip-flops 42 and 42' are both reset, which resets each of the first and second output logic signals. Consequently, the final output logic signal at terminal 24 is also reset. If desired, trigger circuit 100 can also be configured with an output flip-flop 54 to provide a latched output logic signal.

Figure 11:
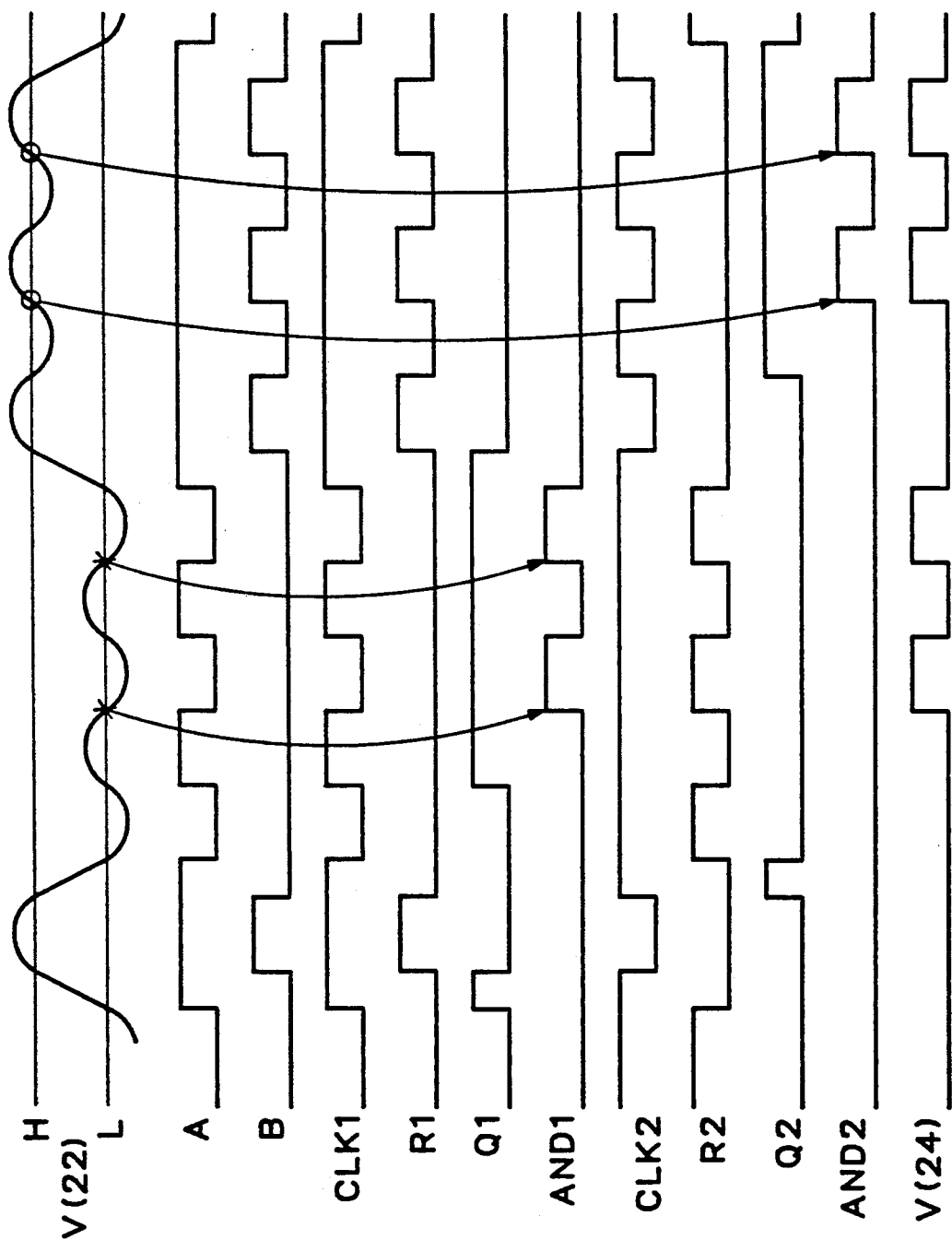
FIG. 11 is a timing diagram for the circuit of FIG. 10.

Corresponding waveforms illustrating the operation of trigger circuit 100 are shown in the timing diagram of FIG. 11. The operation of trigger circuit 100 is very similar to that of trigger circuit 90 described above. Consequently, the waveforms in FIG. 11 are similar to those shown in the timing diagram of FIG. 9. Notable exceptions are the elimination of waveforms C and D and the addition of waveforms CLK1 and CLK2 representing the clock inputs of flip-flops 42 and 42'. Also, the initializing reset waveform is not shown. Waveforms R1 and R2, Q1 and Q2, AND1 and AND2, and V(24) are otherwise identical to corresponding waveforms shown in FIG. 9. Thus, output waveform V(24) still provides four output pulses corresponding to two occurrences of a positive-going limited amplitude input signal and two occurrences of a negative-going limited amplitude input signal.

It is apparent to those skilled in the art that trigger circuits 20, 50, 80, 90, and 100 can be used in conjunction with other trigger circuitry. For example, in a typical oscilloscope, several optional triggering modes are made available to the user of the oscilloscope. Selecting one triggering mode activates and inactivates various triggering circuits or portions thereof. Triggering on limited amplitude input signals with the circuitry and in the manner described above can be one of these optional triggering modes.

It is also apparent to those skilled in the art that each of trigger circuits 20, 50, 80, 90, and 100 can be used as a stand-alone circuit having uses other than triggering an oscilloscope. For example, the output of trigger circuit 80 responsive to each occurrence of a limited amplitude input signal can be counted to record total occurrences. In digital systems, it may be desirable to count each occurrence as representing a system error in order to characterize the overall quality or reliability of the system.

Having illustrated and described the principles of the invention in preferred embodiments, it is apparent to those skilled in the art that the invention can be modified in arrangement and detail without departing from such principles. We claim all modifications that are within the spirit and scope of the following claims.

We claim:

1. A trigger circuit (20) suitable for triggering an oscilloscope on the occurrence of a single-polarity limited amplitude input signal comprising:
   an input terminal (22) for receiving an input signal;
   an output terminal (24);
   means (38) coupled to the input terminal for generating a first logic signal (A) having first and second logic states, the first logic signal changing logic states when the input signal crosses a first threshold voltage (30);
   means (40) coupled to the input terminal for generating a second logic signal (B) having first and second logic states, the second logic signal changing logic states when the input signal crosses a second threshold voltage (34); and
   means (25) for combining the first and second logic signals to provide an output logic signal having first and second logic states at the output terminal such that the output signal changes logic state subsequent to the input signal crossing and recrossing the first threshold voltage without crossing the second threshold voltage.

2. A trigger circuit (20) as in claim 1 in which the combining means (25) comprises:
   a first D-type flip-flop (42) having a clock input for receiving the first logic signal, a D input coupled to a logic high voltage, a reset input for receiving the second logic signal, and an output; and
   a second D-type flip-flop (44) having an inverted clock input for receiving the first logic signal, a D input coupled to the output of the first D-type flip-flop, a reset input for receiving the second logic signal, and an output coupled to the output terminal.

3. A trigger circuit (50) as in claim 1 in which the combining means (55) comprises:
   a D-type flip-flop (42) having a clock input for receiving the first logic signal, a D input coupled to a logic high voltage, a reset input for receiving the second logic signal, and an output; and
   an AND gate (52) having a first input coupled to the output of the D-type flip-flop, a second inverted input for receiving the first logic signal, and an output coupled to the output terminal.

4. A trigger circuit (20) as in claim 1 further comprising reset means (46) having a reset input (36) for resetting the output logic signal.

5. A trigger circuit (20) as in claim 1 further comprising a buffer stage (48) having an input coupled to the output terminal of the trigger circuit, an output coupled to the reset input, and a predetermined delay from the input to the output.

6. A trigger circuit (80) as in claim 1 further comprising an output flip-flop (54) having an input coupled to the output terminal and an output for providing a latched output logic signal.

7. A trigger circuit (90) suitable for triggering an oscilloscope on the occurrence of a dual-polarity limited amplitude input signal comprising:
   an input terminal (22) for receiving an input signal;
   an output terminal (24);
   means (38) coupled to the input terminal for generating a first logic signal (A) having first and second logic states, the first logic signal changing logic states when the input signal crosses a first threshold voltage (30);
   means (40) coupled to the input terminal for generating a second logic signal (B) having first and second logic states, the second logic signal changing logic states when the input signal crosses a second threshold voltage (34);
   means (40') coupled to the input terminal for generating a third logic signal (C) inverted from the second logic signal;
   means (38') coupled to the input terminal for generating a fourth logic signal (D) inverted from the first logic signal;
   first means (55A) having first and second inputs respectively coupled to the first and second logic signals for combining the first and second logic signals and an output for providing a first output logic signal having first and second logic states such that the first output signal changes logic state subsequent to the input signal crossing and recrossing the first threshold voltage without crossing the second threshold voltage;
   second means (55B) having first and second inputs respectively coupled to the third and fourth logic signals for combining the third and fourth logic signals and an output for providing a second output logic signal having first and second logic states such that the second output signal changes logic state subsequent to the input signal crossing and recrossing the second threshold voltage without crossing the first threshold voltage; and
   means (92) coupled to the output terminal for generating the logical OR combination of the first and second output logic signals.

8. A trigger circuit (90) as in claim 7 in which at least one of the first and second logic signal combining means (55A, 55B) comprises:
   a first D-type flip-flop (42) having a clock input forming the first input, a D input coupled to a logic high voltage, a reset input forming the second output, and an output; and
   a second D-type flip-flop (44) having an inverted clock input coupled to the first input, a D input coupled to the output of the first D-type flip-flop, a reset input coupled to the second output, and an output forming the output of the logic signal combining means.

9. A trigger circuit (90) as in claim 7 in which at least one of the first and second logic signal combining means (55A, 55B) comprises:
   a D-type flip-flop (42) having a clock input forming the first input, a D input coupled to a logic high voltage, a reset input forming the second input, and an output; and
   an AND gate (52) having a first input coupled to the output of the D-type flip-flop, a second inverted input coupled to the first input of the logic signal combining means, and an output forming the output of the logic signal combining means.

10. A trigger circuit (90) as in claim 7 further comprising reset means (46) having a reset input (36) for resetting each of the first and second output logic signals.

11. A trigger circuit (90) as in claim 7 further comprising a buffer stage (48) having an input coupled to the output terminal of the trigger circuit, an output coupled to the reset input, and a predetermined delay from the input to the output.

12. A trigger circuit (90) as in claim 7 further comprising an output flip-flop (54) having an input coupled to the output terminal and an output for providing a latched output logic signal.

13. A trigger circuit (100) suitable for triggering an oscilloscope on the occurrence of a dual-polarity limited amplitude input signal comprising:
   an input terminal (22) for receiving an input signal;
   an output terminal (24);
   means (38) coupled to the input terminal for generating a first logic signal (A) having first and second logic states, the first logic signal changing logic states when the input signal crosses a first threshold voltage (30);
   means (46') for generating an inverted first logic signal;
   means (40) coupled to the input terminal for generating a second logic signal (B) having first and second logic states, the second logic signal changing logic states when the input signal crosses a second threshold voltage (34);
   means (104) for generating an inverted second logic signal;

a first D-type flip-flop (42) having a clock input for receiving the first logic signal, a D input coupled to a logic high voltage, a reset input for receiving the second logic signal, and an output;

a first AND gate (52) having a first input coupled to the output of the first D-type flip-flop, a second inverted input for receiving the first logic signal, and an output for generating a first output logic signal;

a second D-type flip-flop (42') having a clock input for receiving the inverted second logic signal, a D input coupled to a logic high voltage, a reset input for receiving the inverted first logic signal, and an output;

a second AND gate (52') having a first input coupled to the output of the second D-type flip-flop, a second inverted input for receiving the inverted second logic signal, and an output for generating a second output logic signal; and an OR gate (92) for generating the logical OR combination of the first and second output logic signals.

14. A trigger circuit (100) as in claim 13 further comprising reset means (46, 46') having a reset input (36) for resetting the each of the first and second output logic signals.

15. A trigger circuit (100) as in claim 13 further comprising an output flip-flop (54) having an input coupled to the output terminal and an output for providing a latched output logic signal.

16. A method for indicating the occurrence of a single-polarity limited amplitude input signal, the method comprising:

providing an input signal;

generating a first logic signal (A) having first and second logic states, the first logic signal changing logic states when the input signal crosses a first threshold voltage (30);

generating a second logic signal (B) having first and second logic states, the second logic signal changing logic states when the input signal crosses a second threshold voltage (34); and combining the first and second logic signals to provide an output logic signal having first and second logic states at the output terminal such that the output signal changes logic state subsequent to the input signal crossing and recrossing the first threshold voltage without crossing the second threshold voltage.

17. A method for indicating the occurrence of a dual-polarity limited amplitude input signal, the method comprising:

providing an input signal;

generating a first logic signal (A) having first and second logic states, the first logic signal changing logic states when the input signal crosses a first threshold voltage (30);

generating a second logic signal (B) having first and second logic states, the second logic signal changing logic states when the input signal crosses a second threshold voltage (34);

generating a third logic signal (C) inverted from the second logic signal;

generating a fourth logic signal (D) inverted from the first logic signal;

combining the first and second logic signals to provide a first output logic signal having first and second logic states such that the first output signal changes logic state subsequent to the input signal crossing and recrossing the first threshold voltage without crossing the second threshold voltage;

combining the third and fourth logic signals to provide a second output logic signal having first and second logic states such that the second output signal changes logic state subsequent to the input signal crossing and recrossing the second threshold voltage without crossing the first threshold voltage; and generating the logical OR combination of the first and second output logic signals.

* * * * *